US011818933B2

(12) United States Patent
Zhao et al.

(10) Patent No.: US 11,818,933 B2
(45) Date of Patent: Nov. 14, 2023

(54) DISPLAY PANEL AND DISPLAY DEVICE WITH VIRTUAL PIXEL CIRCUIT ELECTRICALLY CONNECTED TO LIGHT EMITTING DEVICE IN DISPLAY AREA

(71) Applicants: Chengdu BOE Optoelectronics Technology Co., Ltd., Chengdu (CN); BOE Technology Group Co., Ltd., Beijing (CN)

(72) Inventors: Yanqiu Zhao, Beijing (CN); Yao Huang, Beijing (CN); Yue Long, Beijing (CN); Benlian Wang, Beijing (CN); Weiyun Huang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 195 days.

(21) Appl. No.: 17/218,902

(22) Filed: Mar. 31, 2021

(65) Prior Publication Data
US 2022/0028938 A1    Jan. 27, 2022

(30) Foreign Application Priority Data
Jul. 24, 2020  (CN) .......................... 202010723788.4

(51) Int. Cl.
*H10K 59/35*  (2023.01)
*H10K 59/131*  (2023.01)

(52) U.S. Cl.
CPC ......... *H10K 59/353* (2023.02); *H10K 59/131* (2023.02)

(58) Field of Classification Search
CPC ............ H01L 27/3218; H01L 27/3276; H10K 59/353; H10K 59/131
See application file for complete search history.

(56) References Cited

U.S. PATENT DOCUMENTS

| 2014/0239846 | A1* | 8/2014 | Shoji | ...................... H05B 45/60 315/297 |
| 2015/0123884 | A1* | 5/2015 | Kim | ...................... G09G 3/3208 345/82 |
| 2015/0294620 | A1* | 10/2015 | Cho | ...................... G09G 3/3233 345/77 |
| 2015/0364531 | A1* | 12/2015 | Kim | .................... H01L 27/3276 438/4 |
| 2020/0176527 | A1* | 6/2020 | An | ...................... H01L 27/3276 |

* cited by examiner

*Primary Examiner* — Lex H Malsawma
(74) *Attorney, Agent, or Firm* — ArentFox Schiff LLP; Michael Fainberg

(57) ABSTRACT

Disclosed in the embodiments of the present disclosure are a display panel and a display device. The display panel includes: a display area and a peripheral area surrounding the display area, the display area includes a first display area and a second display area; a plurality of virtual pixel circuits and a plurality of drive pixel circuits, the plurality of virtual pixel circuits are arranged in the peripheral area, and the plurality of drive pixel circuits are arranged in the second display area; the plurality of first light emitting devices are arranged in the first display area, and the plurality of second light emitting devices are arranged in the second display area; the virtual pixel circuit is electrically connected with the first light emitting device, and the drive pixel circuit is electrically connected with the second light emitting device.

18 Claims, 8 Drawing Sheets

DISPLAY PANEL AND DISPLAY DEVICE WITH VIRTUAL PIXEL CIRCUIT ELECTRICALLY CONNECTED TO LIGHT EMITTING DEVICE IN DISPLAY AREA

The present disclosure claims the priority from Chinese Patent Application No. 202010723788.4, filed with the China National Intellectual Property Administration on Jul. 24, 2020 and entitled "Display Panel and Display Device", the entire content of which is hereby incorporated by reference.

FIELD

The present disclosure relates to the field of display technology, in particular to a display panel and a display device.

BACKGROUND

Along with rapid development of the display technology, the screen-to-body ratio of display products has gradually increased. However, such display products as cell phones need to be set with front cameras, sensors and other components, which is unfavorable for full screen designs.

SUMMARY

Embodiments of the present disclosure provide a display panel and a display device.

In a first aspect, an embodiment of the present disclosure provides a display panel, including:

a base substrate, including a display area and a peripheral area surrounding the display area, the display area includes a first display area and a second display area;

a plurality of pixel circuits, including a plurality of virtual pixel circuits and a plurality of drive pixel circuits, the plurality of virtual pixel circuits are arranged in the peripheral area, and the plurality of drive pixel circuits are arranged in the second display area;

a plurality of light emitting devices, arranged on a side, facing away from the base substrate, of the plurality of pixel circuits, the plurality of light emitting devices include a plurality of first light emitting devices and a plurality of second light emitting devices, the plurality of first light emitting devices are arranged in the first display area, and the plurality of second light emitting devices are arranged in the second display area;

at least one of the virtual pixel circuits is electrically connected with at least one of the first light emitting devices, and the at least one of the drive pixel circuits is electrically connected with the at least one of the second light emitting devices.

In some embodiments, the plurality of first light emitting devices are arranged in the first display area in an array, and the plurality of second light emitting devices are arranged in the second display area in an array, a row of the first light emitting devices and a row of the second light emitting devices are arranged in the same row; and/or, a column of the first light emitting devices and a column of the second light emitting devices are arranged in the same column.

In some embodiments, the peripheral area includes a first peripheral sub-area and a second peripheral sub-area which are arranged oppositely, and a third peripheral sub-area and a fourth peripheral sub-area which are arranged oppositely;

the first peripheral sub-area, the first display area and the second peripheral sub-area are arranged along a first direction, and the third peripheral sub-area, the first display area and the fourth peripheral sub-area are arranged along a second direction, the first direction is different from the second direction; and the plurality of virtual pixel circuits are arranged in at least one of the first peripheral sub-area, the second peripheral sub-area, the third peripheral sub-area and the fourth peripheral sub-area, and the virtual pixel circuit is electrically connected with the first light emitting device through at least one connecting trace.

In some embodiments, the distance between the first peripheral sub-area and the first display area is less than the distance between the second peripheral sub-area and the first display area, and the plurality of virtual pixel circuits are arranged in the first peripheral sub-area.

In some embodiments, the first peripheral sub-area includes a plurality of first virtual areas which are arranged along the second direction, the plurality of virtual pixel circuits are respectively arranged in an array in each of the first virtual areas;

the plurality of first light emitting devices are divided into a plurality of first row groups; and each of the first row groups includes at least two adjacent rows of first light emitting devices; and one of the first row groups corresponds to one of the first virtual areas, and one first light emitting device in the first row group is electrically connected with one virtual pixel circuit in the corresponding first virtual area through the connecting trace.

In some embodiments, the first row group includes a first sub-row group and a second sub-row group; the first display area has a first center line along the first direction, and the first light emitting devices in the first sub-row group and the first light emitting devices in the second sub-row group are symmetrically arranged with respect to the first center line;

the first virtual area includes a first sub-virtual area and a second sub-virtual area; the first sub-virtual area and the second sub-virtual area are symmetrically arranged with respect to the first center line, and the first sub-row group and the first sub-virtual area are arranged on the same side of the first center line;

the first light emitting device in the first sub-row group is electrically connected with the virtual pixel circuit in the first sub-virtual area through the connecting trace; and the first light emitting device in the second sub-row group is electrically connected with the virtual pixel circuit in the second sub-virtual area through the connecting trace.

In some embodiments, in the same first row group, the connecting traces corresponding to the first sub-row group and the connecting traces corresponding to the second sub-row group are symmetrically arranged with respect to the first center line.

In some embodiments, the second display area further includes a plurality of drive gate lines and a plurality of drive data lines; a row of the drive pixel circuits are electrically connected with one of the drive gate lines, and a column of the drive pixel circuits are electrically connected with one of the drive data lines;

the first sub-virtual area further includes: a plurality of first sub-virtual gate lines and a plurality of first sub-virtual data lines; in the first sub-virtual area, a row of the virtual pixel circuits are electrically connected with one of the first sub-virtual gate lines, and a column of the virtual pixel circuits are electrically connected with one of the first sub-virtual data lines;

the second sub-virtual area further includes: a plurality of second sub-virtual gate lines and a plurality of second sub-virtual data lines; in the second sub-virtual area, a row of the virtual pixel circuits are electrically connected with one of the second sub-virtual gate lines, and a column of the virtual pixel circuits are electrically connected with one of the second sub-virtual data lines;

for the first light emitting devices and the second light emitting devices in the same row, a drive signal transmitted by the first sub-virtual gate line electrically connected with the virtual pixel circuit corresponding to the first light emitting device, a drive signal transmitted by the second sub-virtual gate line electrically connected with the virtual pixel circuit corresponding to the first light emitting device, and a drive signal transmitted by the drive gate line electrically connected with the drive pixel circuit corresponding to the second light emitting device are the same; and for the first light emitting devices and the second light emitting devices in the same column, the first sub-virtual data line electrically connected with the virtual pixel circuit corresponding to the first light emitting device, the second sub-virtual data line electrically connected with the virtual pixel circuit corresponding to the first light emitting device, and the drive data line electrically connected with the drive pixel circuit corresponding to the second light emitting device are electrically connected with each other.

In some embodiments, the peripheral area further includes: a gate drive circuit electrically connected with the plurality of drive gate lines, the gate drive circuit is configured to input the drive signals to the plurality of drive gate lines, and for the first light emitting devices and the second light emitting devices in the same row, the first sub-virtual gate line electrically connected with the virtual pixel circuit corresponding to the first light emitting device, and the second sub-virtual gate line electrically connected with the virtual pixel circuit corresponding to the first light emitting device are electrically connected with the drive gate line which is electrically connected with the drive pixel circuit corresponding to the second light emitting device; or, the peripheral area further includes: a gate drive circuit electrically connected with the plurality of drive gate lines, a first virtual gate drive circuit electrically connected with the plurality of first sub-virtual gate lines, and a second virtual gate drive circuit electrically connected with the plurality of second sub-virtual gate lines; the gate drive circuit is configured to input the drive signals to the plurality of drive gate lines, the first virtual gate drive circuit is configured to input the drive signals to the plurality of first sub-gate lines, and the second virtual gate drive circuit is configured to input the drive signals to the plurality of second sub-gate lines.

In some embodiments, part of the plurality of virtual pixel circuits are arranged in the third peripheral sub-area, and the rest of the plurality of virtual pixel circuits are arranged in the fourth peripheral sub-area.

In some embodiments, the second display area further includes a plurality of drive gate lines and a plurality of drive data lines; a row of the drive pixel circuits are electrically connected with one of the drive gate lines, and a column of the drive pixel circuits are electrically connected with one of the drive data lines;

the third peripheral sub-area further includes: a plurality of second virtual gate lines and a plurality of second virtual data lines; in the third peripheral sub-area, a row of the virtual pixel circuits are electrically connected with one of the second virtual gate lines, and a column of the virtual pixel circuits are electrically connected with one of the second virtual data line;

the fourth peripheral sub-area further includes: a plurality of third virtual gate lines and a plurality of third virtual data lines; in the fourth peripheral sub-area, a row of the virtual pixel circuits are electrically connected with one of the third virtual gate lines, and a column of the virtual pixel circuits are electrically connected with one of the third virtual data lines;

for the first light emitting devices and the second light emitting devices in the same row, a drive signal transmitted by the second virtual gate line electrically connected with the virtual pixel circuit corresponding to the first light emitting device, a drive signal transmitted by the third virtual gate line electrically connected with the virtual pixel circuit corresponding to the first light emitting device, and a drive signal transmitted by the drive gate line electrically connected with the drive pixel circuit corresponding to the second light emitting device are the same; and for the first light emitting devices and the second light emitting devices in the same column, the second virtual data line electrically connected with the virtual pixel circuit corresponding to the first light emitting device, the third virtual data line electrically connected with the virtual pixel circuit corresponding to the first light emitting device and the drive data line electrically connected with the drive pixel circuit corresponding to the second light emitting device are electrically connected with each other.

In some embodiments, the peripheral area further includes: a gate drive circuit electrically connected with the plurality of drive gate lines, the gate drive circuit is configured to input the drive signals to the plurality of drive gate lines, and for the first light emitting devices and the second light emitting devices in the same row, the second virtual gate line electrically connected with the virtual pixel circuit corresponding to the first light emitting device, the third virtual gate line electrically connected with the virtual pixel circuit corresponding to the first light emitting device, and the drive gate line electrically connected with the drive pixel circuit corresponding to the second light emitting device are the same gate line; or, the peripheral area further includes: a gate drive circuit electrically connected with the plurality of drive gate lines, a second virtual gate drive circuit electrically connected with the plurality of second virtual gate lines and a third virtual gate drive circuit electrically connected with the plurality of third virtual gate lines, the gate drive circuit is configured to input the drive signals to the plurality of drive gate lines, the second virtual gate drive circuit is configured to input the drive signals to the plurality of second virtual gate lines, and the third virtual gate drive circuit is configured to input the drive signals to the plurality of third virtual gate lines.

In a second aspect, an embodiment of the present disclosure further provides a display device which includes the above display panel.

DETAILED DESCRIPTION OF THE EMBODIMENTS

Figure 1A:
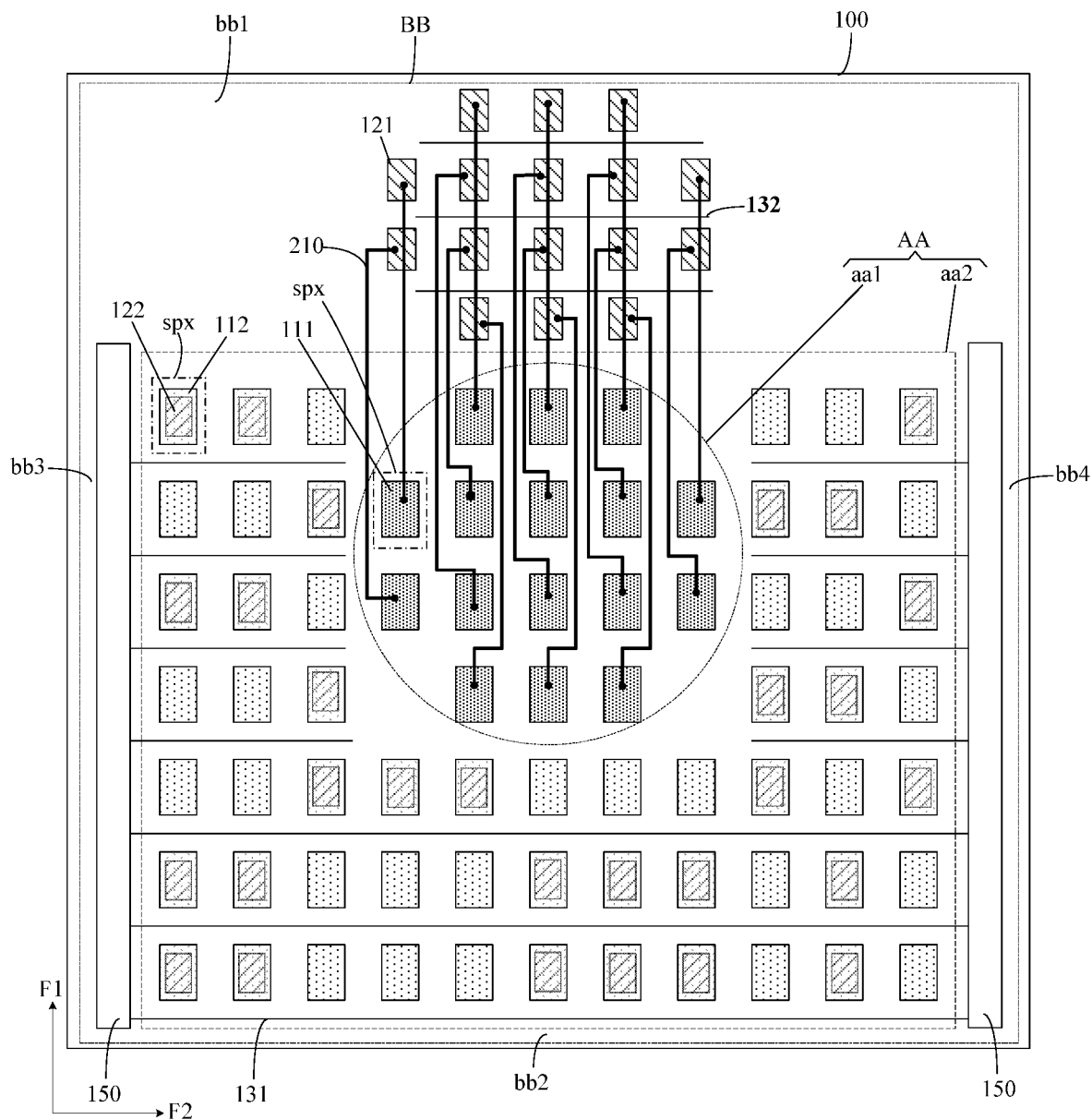
FIG. 1A is a structural schematic diagram of a display panel, provided by an embodiment of the present disclosure.

To make the objectives, technical solutions and advantages of embodiments of the present disclosure clearer, the technical solutions in embodiments of the present disclosure will be described below clearly and completely in conjunction with the accompanying drawings in embodiments of the present disclosure. Obviously, the described embodiments are only a part of embodiments of the present disclosure, and not all the embodiments. Moreover, embodiments in the present disclosure and the characteristics in embodiments can be combined with each other without conflict. Based on embodiments described in the present disclosure, all the other embodiments obtained by those of ordinary skills in the art without creative work fall within the protection scope of the present disclosure.

Unless otherwise defined, technical or scientific terms used in the present disclosure have ordinary meanings understood by those of ordinary skills in the art to which the present disclosure pertains. The words "first", "second" and the like used in the present disclosure do not indicate any order, quantity or importance, but are only used to distinguish different components. Words such as "comprise" or "include" mean that an element or item appearing before such a word covers listed elements or items appearing after the word and equivalents thereof, and do not exclude other elements or items. Words such as "connect" or "interconnect" are not limited to physical or mechanical connections, but may include electrical connections, regardless of direct or indirect connection.

It should be noted that, sizes and shapes in the drawings do not reflect the true scale, and are merely intended to schematically illustrate the present disclosure. Furthermore, the same or similar reference numerals throughout represent the same or similar elements or elements having the same or similar functions.

With such advantages as low energy consumption and self-illumination, the display panel of an organic light emitting diode (OLED) is one of the hot spots in the research field of display panels of flat panels. Since OLED is a current-driven light-emitting device, it needs a constant current to control its light emitting. For general OLED display panels, a pixel circuit is adopted to generate a drive current to drive the OLED to emit light. In some embodiments, the pixel circuit is generally provided with a transistor and a capacitor, and then a drive current can be generated through mutual combination between the transistor and the capacitor to drive the OLED to emit light.

To improve homogeneity of characteristics of the transistor in the pixel circuit, as shown in FIG. 1A, a virtual pixel circuit 121 can be set in the peripheral area BB surrounding the display area AA, to simultaneously prepare the pixel circuit in the display area AA and the virtual pixel circuit 121 in the peripheral area BB, so as to improve homogeneity of the transistor in the display area AA.

In view of this, embodiments of the present disclosure provide a display panel, as shown in FIG. 1A, the first light emitting device 111 in the first display area aa1 is driven to emit light through the virtual pixel circuit 121 in the peripheral area BB, so that the first display area aa1 can achieve the light-emitting display effect, thereby not only enabling the whole display area AA to achieve the light-emitting display effect, but also improving the light transmittance in the first display area aa1.

Figure 1B:
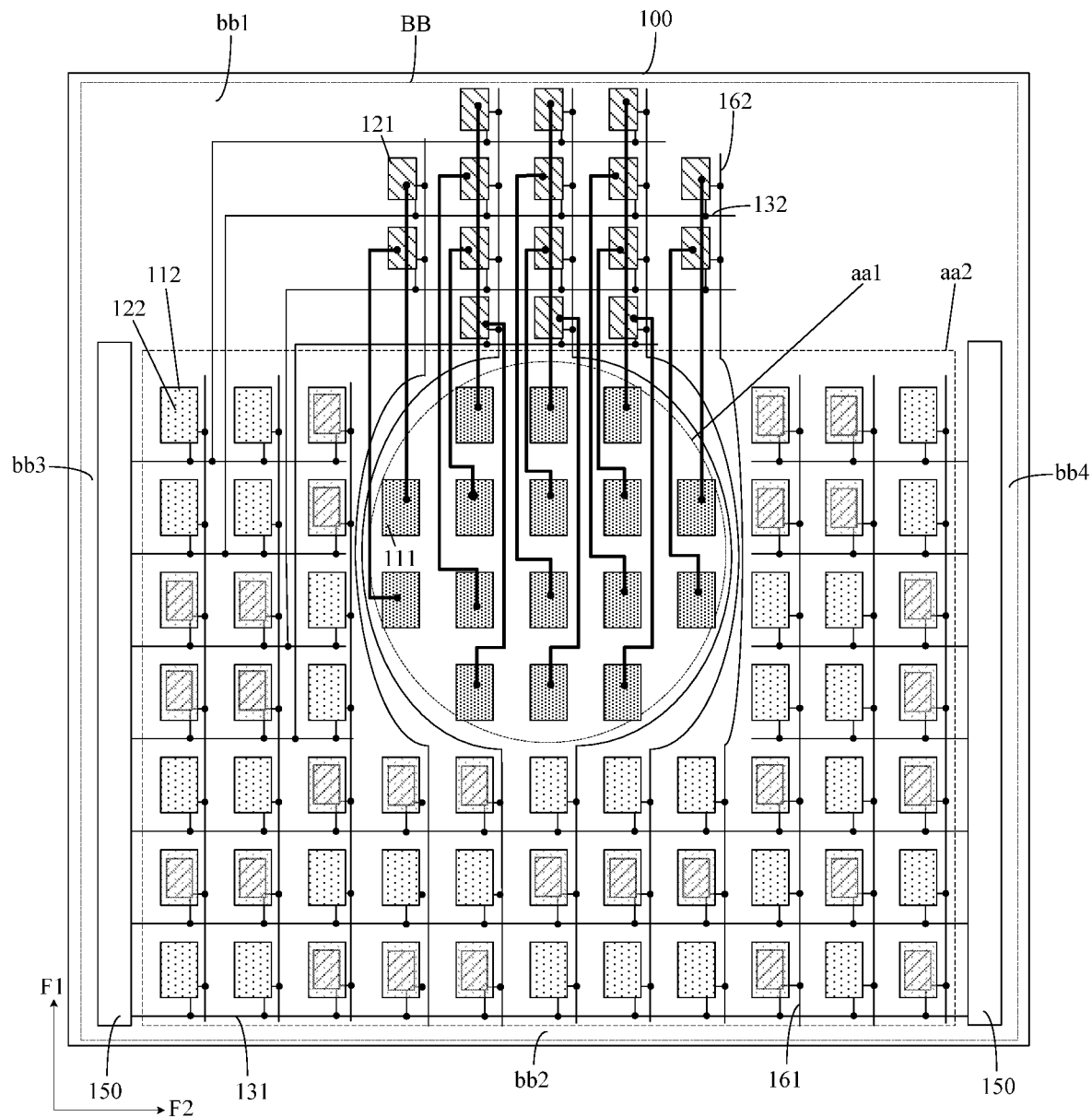
FIG. 1B is another structural schematic diagram of a display panel, provided by an embodiment of the present disclosure.

In some embodiments, the present disclosure provides a display panel, as shown in FIG. 1A and FIG. 1B, the display panel can include:

a base substrate 100, including a display area AA and a peripheral area BB surrounding the display area AA, the display area AA includes a first display area aa1 and a second display area aa2;

a plurality of pixel circuits, including a plurality of virtual pixel circuits 121 and a plurality of drive pixel circuits 122, the plurality of virtual pixel circuits 121 are arranged in the peripheral area BB, and the plurality of drive pixel circuits 122 are arranged in the second display area aa2;

a plurality of light emitting devices, arranged on a side, facing away from the base substrate 100, of the plurality of pixel circuits, the plurality of light emitting devices include a plurality of first light emitting devices 111 and a plurality of second light emitting devices 112, the plurality of first light emitting devices 111 are arranged in the first display area aa1, and the plurality of second light emitting devices 112 are arranged in the second display area aa2;

at least one virtual pixel circuit 121 is electrically connected with at least one of the first light emitting devices 111, and at least one drive pixel circuit 122 is electrically connected with at least one second light emitting device 112.

In some embodiments, through using the drive pixel circuit 122 in the second display area aa2 to drive the second light emitting device 112 in the second display area aa2 to emit light, the second display area aa2 can achieve a light-emitting display effect. And, through using the virtual pixel circuit 121 in the peripheral area BB to drive the first light emitting device 111 in the first display area aa1 to emit light, the first display area aa1 can achieve a light-emitting display effect. Therefore, the whole display area AA can achieve a light-emitting display effect. Since the first display area aa1 is provided with a first light emitting device 111 and is not provided with a pixel circuit or metal traces (for example, a drive gate line 131 and a drive data line 161), therefore, not only the first display area aa1 can achieve a display function, but also the first display area aa1 does not need to be provided with pixel circuit and metal traces, so that light transmittance of the first display area aa1 is improved. In this way, when the display panel is applied to the display device, a front camera, a sensor, a receiver and other elements can be arranged below the first display area aa1 of the display panel, to achieve full screen design and improve the screen-to-body ratio.

In some embodiments, the virtual pixel circuit 121 which drives the first light emitting device 111 to emit light can be the virtual pixel circuit which is arranged in the peripheral area BB to improve homogeneity of the characteristics of the transistor of the pixel circuit in the display area. In this way, through reusing this part of virtual pixel circuit 121 in the peripheral area BB to drive the first light emitting device 111 in the first display area aa1 to emit light, the first display area aa1 can achieve a light-emitting display effect. Moreover, there is no need to set up additional virtual pixel circuits in the peripheral area BB, thereby ensuring that the width of the peripheral area BB is small.

In some embodiments, the display panel can include: a plurality of pixel units arranged in the first display area aa1 and the second display area aa2 in an array. Each pixel unit includes a plurality of sub-pixels spx. Exemplarily, the pixel unit can include a red sub-pixel, a green sub-pixel and a blue sub-pixel, in this way, color display can be achieved through mixing red, green and blue. Or, a pixel unit can also include a red sub-pixel, a green sub-pixel, a blue sub-pixel and a white sub-pixel, in this way, color display can be achieved through mixing red, green, blue and white. Of course, during practical applications, the light emitting color of the sub-pixel in the pixel unit can be designed and determined according to actual application environment, which is not defined herein.

In some embodiments, the pixel distribution density in the first display area aa1 can be less than the pixel distribution density in the second display area aa2, in this way, the light transmittance of the first display area aa1 can be further improved.

In some embodiments, a plurality of first light emitting devices 111 are arranged in the first display area aa1 in an array, and a plurality of second light emitting devices 112 are arranged in the second display area aa2 in an array. For example, in the first display area aa1, a sub-pixel can include a first light emitting device 111. In the second display area aa2, a sub-pixel can include a drive pixel circuit 122 and a second light emitting device 112, and the drive pixel circuit 122 and the second light emitting device 112 in the same sub-pixel are electrically connected with each other. And, a row of the first light emitting devices 111 and a row of the second light emitting devices 112 can be in the same row, and a column of the first light emitting devices 111 and a column of the second light emitting devices 112 can be in the same column. In this way, the first light emitting devices 111 in the first display area aa1 and the second light emitting devices 112 in the second display area aa2 can be set uniformly.

In some embodiments, the first light emitting device 111 and the second light emitting device 112 can respectively include: an anode, a light emitting layer and a cathode which are arranged in a stacked manner. And, the virtual pixel circuit 121 is electrically connected with the anode of the first light emitting device 111, and the drive pixel circuit 122 is electrically connected with the anode of the second light emitting device 112. In some embodiments, the first light emitting device 111 and the second light emitting device 112 can include: at least one of an OLED, a quantum dot light emitting diode (QLED), a Micro LED and a Mini LED. In some embodiments, the anode and the cathode of the first light emitting device 111 can be transparent conductive materials, such as indium tin oxide (ITO) material, indium zinc oxide (IZO) material, carbon nano tubes or graphene, etc. The anode of the second light emitting device 112 can be reflective conductive materials, such as metal materials, for example, gold, silver, aluminum, etc. The cathode of the second light emitting device 112 can be transparent conductive materials, such as indium tin oxide (ITO) material, indium zinc oxide (IZO) material, carbon nano tubes or graphene, etc., which is not defined herein.

Figure 2:
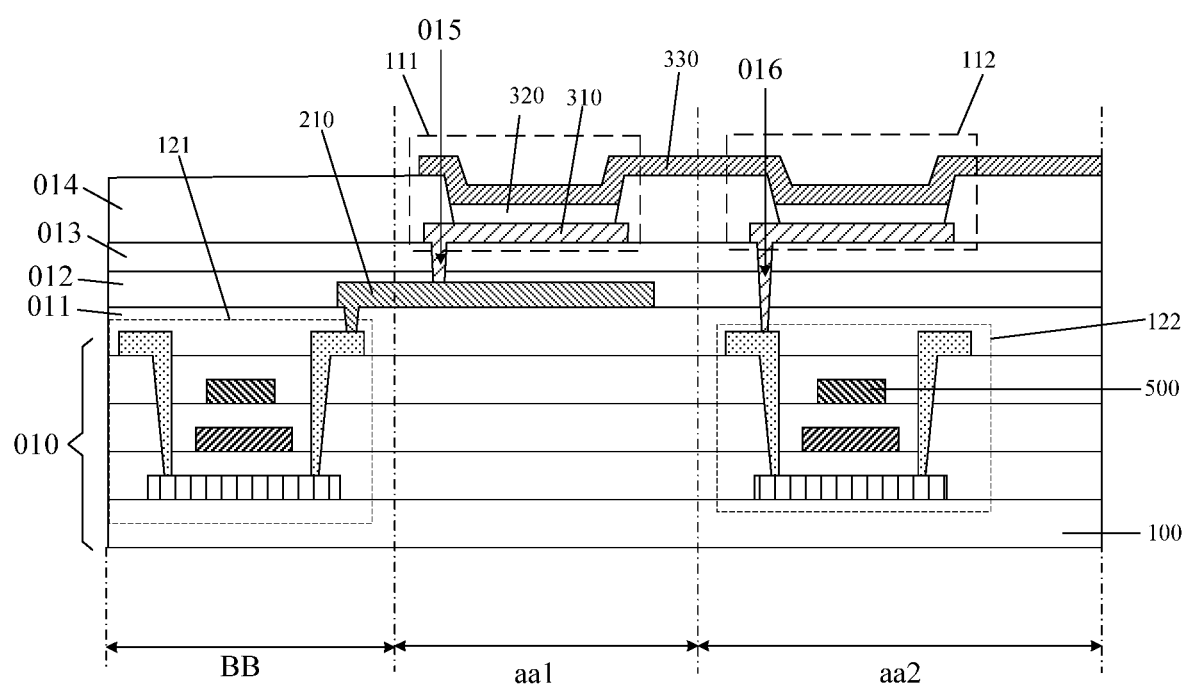
FIG. 2 is a partial cross-sectional structure schematic diagram of a display panel, provided by an embodiment of the present disclosure.

In some embodiments, the virtual pixel circuit 121 and the drive pixel circuit 122 can respectively include a plurality of transistors and capacitors. In some embodiments, as shown in FIG. 2, with one transistor in the virtual pixel circuit 121 as an example, and with one transistor in the drive pixel circuit 122 as an example, the display panel can include a transistor array 010 arranged on the base substrate 100, a first planarization layer 011 arranged on a side, facing away from the base substrate 100, of the transistor array 010, a connecting trace 210 arranged on a side, facing away from the base substrate 100, of the first planarization layer 011, a second planarization layer 012 arranged on a side, facing away from the base substrate 100, of the connecting trace 210, a third planarization layer 013 arranged on a side, facing away from the base substrate 100, of the second planarization layer 012, an anode 310 arranged on a side, facing away from the base substrate 100, of the third planarization layer 013, a pixel defining layer 014 arranged on a side, facing away from the base substrate 100, of the anode 310, a light emitting layer 320 arranged on a side, facing away from the base substrate 100, of the pixel defining layer 014, and a cathode 330 arranged on a side, facing away from the base substrate 100, of the light emitting layer 320. And, the transistor array 010 includes an active layer, a gate insulating layer, a gate, an interlayer dielectric layer, a capacitor electrode layer, an interlayer insulating layer, and a source/drain electrode layer. In some embodiments, in the second display area aa2, the drain electrode of the transistor in the drive pixel circuit 122 is directly electrically connected with the anode 310 of the second light emitting device 112 through a second via hole 016 which penetrates through the first planarization layer 011, the second planarization layer 012 and the third planarization layer 013. The virtual pixel circuit 121 in the peripheral area BB can be electrically connected with the first light emitting device 111 in the first display area aa1 through at least one connecting trace 210. In some embodiments, one end of the connecting trace 210 is electrically connected with the drain electrode of the transistor in the virtual pixel circuit 121 through a via hole which penetrates through the first planarization layer 011, and the other end of the connecting trace 210 is electrically connected with the anode 310 of the first light emitting device 111 through a first via hole 015 which penetrates through the second planarization layer 012 and the third planarization layer 013.

In some embodiments, as shown in FIG. 1A, one virtual pixel circuit 121 can be electrically connected with one first light emitting device 111 through one connecting trace 210. In some embodiments, the material of the connecting trace 210 can be transparent conductive materials, for example, indium tin oxide (ITO) material, indium zinc oxide (IZO) material, carbon nano tubes or graphene, etc., which is not defined herein.

In some embodiments, as shown in FIG. 1A and FIG. 1B, the connecting traces 210 are arranged at intervals, to avoid influence on the display caused by short circuit between adjacent connecting traces 210. In some embodiments, a gap exists between the orthographic projection of the connecting trace 210 on the base substrate 100 and the orthographic projection of the second via hole 016 on the base substrate 100, thereby avoiding influencing the display effect caused by electrical connection between the connecting trace 210 and the second light emitting device 112.

In some embodiments, as shown in FIG. 1A and FIG. 1B, the peripheral area BB includes a first peripheral sub-area bb1 and a second peripheral sub-area bb2 arranged oppositely, and a third peripheral sub-area bb3 and a fourth peripheral sub-area bb4 arranged oppositely. Moreover, the first peripheral sub-area bb1, the first display area aa1 and the second peripheral sub-area bb2 are arranged along the first direction F1, and the third peripheral sub-area bb3, the first display area aa1 and the fourth peripheral sub-area bb4 are arranged along a second direction F2; the first direction F1 is different from the second direction F2. In some embodiments, a plurality of virtual pixel circuits 121 are arranged in at least one of the first peripheral sub-area bb1, the second peripheral sub-area bb2, the third peripheral sub-area bb3 and the fourth peripheral sub-area bb4. Exemplarily, the peripheral area BB has four sides, two of the sides are arranged oppositely, while the other two sides are arranged oppositely. A plurality of virtual pixel circuits 121 are arranged in at least one of the four sides. Exemplarily, the first direction F1 can be the extension direction of a row of the sub-pixel, and the second direction F2 can be the extension direction of a column of the sub-pixel. Or, the first direction F1 can be the extension direction of a column of the sub-pixel, while the second direction F2 can be the extension direction of a row of the sub-pixel, which is not defined herein.

In some embodiments, as shown in FIG. 1A and FIG. 1B, the distance between the first peripheral sub-area bb1 and the first display area aa1 is less than the distance between the second peripheral sub-area bb2 and the first display area aa1. Exemplarily, the smallest distance between the edge of the first peripheral sub-area bb1 and the center of the first display area aa1 is less than the smallest distance between the edge of the second peripheral sub-area bb2 and the center of the first display area aa1. In some embodiments, the second display area aa2 surrounds the first display area aa1. The first display area aa1 is adjacent to the edge of the first peripheral sub-area bb1. Further, a plurality of virtual pixel circuits 121 are arranged in the first peripheral sub-area bb1 in an array. In this way, the length of the connecting trace 210 between a plurality of virtual pixel circuits 121 and the first light emitting device 111 can be reduced, thereby reducing the problem of large resistance caused by a longer connecting trace 210.

In some embodiments, as shown in FIG. 1A and FIG. 1B, the second display area aa2 can further include a plurality of drive gate lines 131 and a plurality of drive data lines 161; a row of drive pixel circuits 122 are electrically connected with one drive gate line 131, and a column of drive pixel circuits 122 are electrically connected with one drive data line 161. In this way, drive signals can be provided to the drive pixel circuit 122 through a drive gate line 131, and data display signals can be provided to the drive pixel circuit 122 through the drive data line 161, such that the drive pixel circuit 122 controls the second light emitting device 112 to emit light.

Figure 3A:
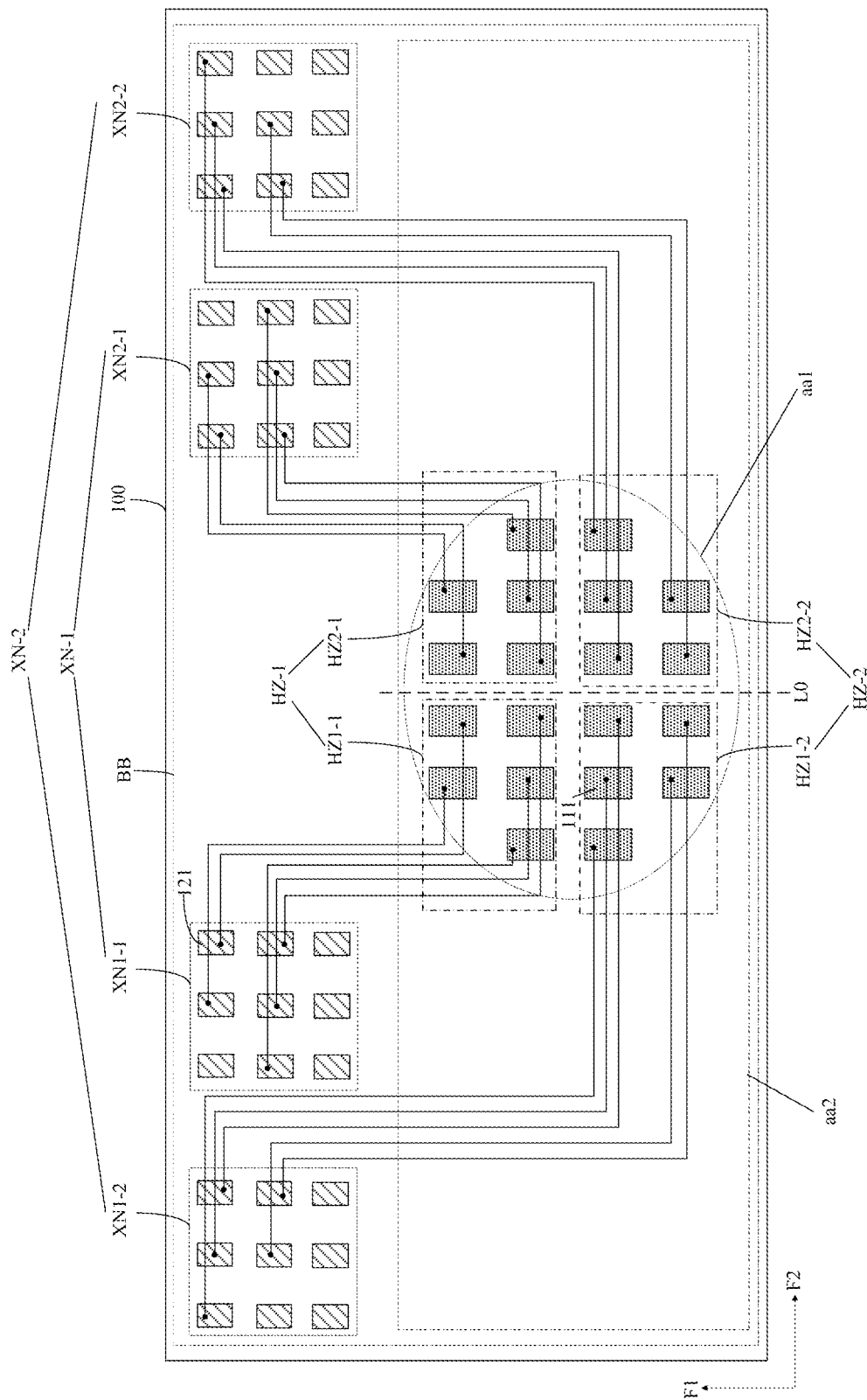
FIG. 3A is another structural schematic diagram of a display panel, provided by an embodiment of the present disclosure.
Figure 3B:
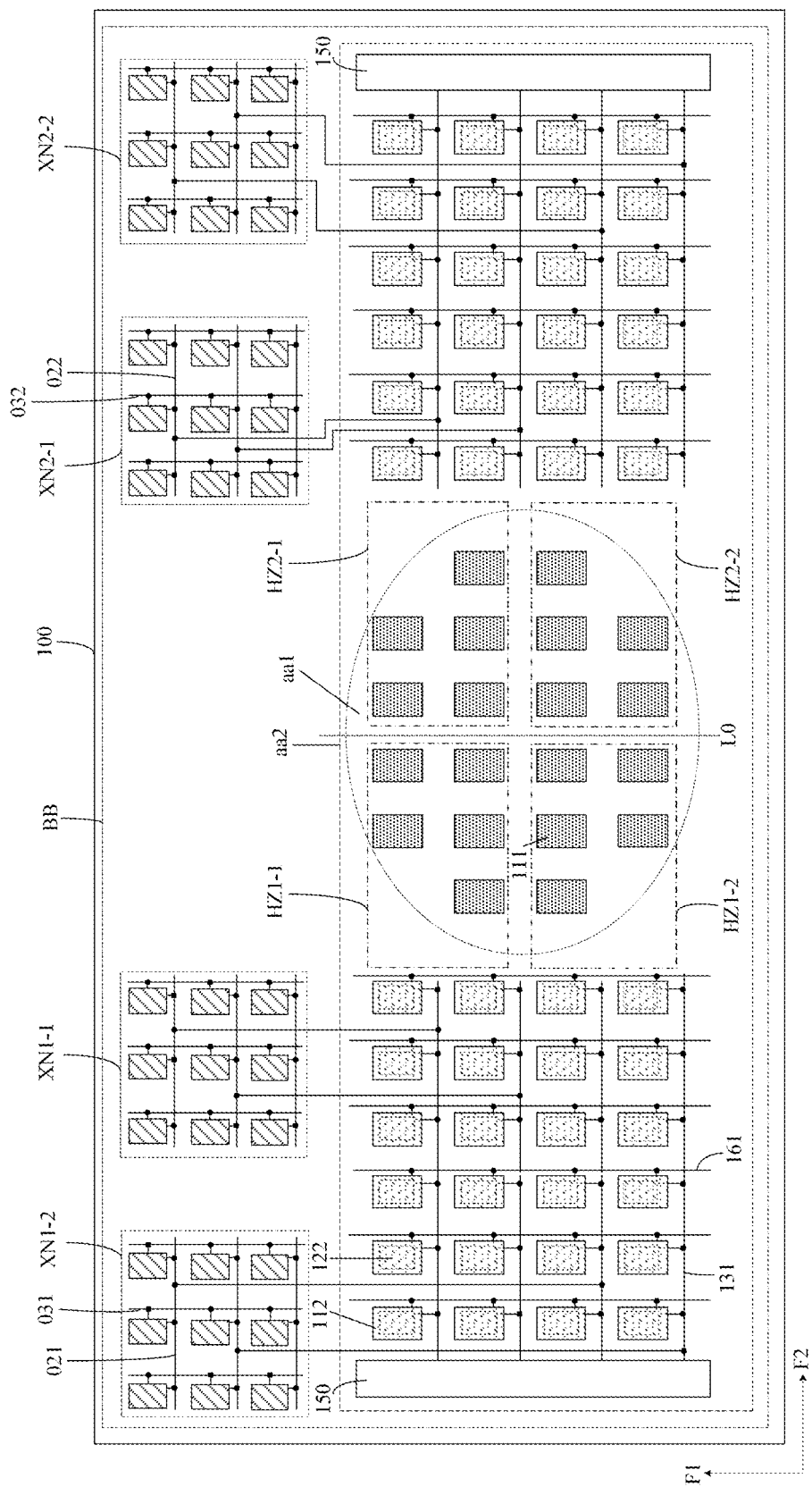
FIG. 3B is another structural schematic diagram of a display panel, provided by an embodiment of the present disclosure.

In some embodiments, as shown in FIG. 3A and FIG. 3B, the first peripheral sub-area bb1 can include a plurality of first virtual areas XN-k (1≤k≤K, k and K are integers, K=2 is taken as an example in the figures) arranged along the second direction F2, the plurality of virtual pixel circuits are respectively arranged in an array in each of the first virtual areas XN-k. In some embodiments, the number of the plurality of virtual pixel circuits included in each first virtual area XN-k can be the same. Of course, the number of the plurality of virtual pixel circuits included in part of the first virtual area XN-k can be the same, while the number of the plurality of virtual pixel circuits included in the rest part of the first virtual area XN-k is different, which is not defined herein.

In some embodiments, as shown in FIG. 3A and FIG. 3B, a plurality of first light emitting devices can be divided into a plurality of first row groups HZ-k, and each first row group HZ-k can include at least two adjacent rows of first light emitting devices. Exemplarily, the number of the first row group can be the same as the number of the first virtual area, then one first row group can correspond to one first virtual area, and a first light emitting device in the first row group is electrically connected with a virtual pixel circuit in the corresponding first virtual area through a connecting trace. For example, as shown in FIG. 3A and FIG. 3B, each first row group HZ-k can include two adjacent rows of first light emitting devices. Or, each first row group HZ-k can also include three adjacent rows of first light emitting devices. Or, each first row group HZ-k can also include four adjacent rows of first light emitting devices. Of course, during practical applications, the number of rows of the first light emitting devices included in each first row group HZ-k can be determined according to requirements of the practical application environments, which is not defined herein.

In some embodiments, as shown in FIG. 3A and FIG. 3B, the first row group HZ-k can include a first sub-row group HZ1-*k* and a second sub-row group HZ2-*k*, the first display area aa1 can have a first center line L0 along the first direction F1. And, the first display area aa1 can be arranged symmetrically approximately about the first center line L0. Moreover, the first virtual area XN-k can include a first sub-virtual area XN1-*k* and a second sub-virtual area XN2-*k*, the first sub-virtual area XN1-*k* and the second sub-virtual area XN2-*k* are symmetrically arranged with respect to the first center line L0.

In some embodiments, as shown in FIG. 3A and FIG. 3B, in the same first row group HZ-k, the first light emitting devices 111 in the first sub-row group HZ1-*k* and the first light emitting devices 111 in the second sub-row group HZ2-*k* can be symmetrically arranged with respect to the first center line. And, in the same first virtual area XN-k, the first sub-virtual area XN1-*k* and the second sub-virtual area XN2-*k* can also be symmetrically arranged with respect to the first center line L0. In some embodiments, the first sub-row group HZ1-*k* and the first sub-virtual area XN1-*k* are arranged on the same side of the first center line L0, that is, the first sub-row group HZ1-*k* and the first sub-virtual area XN1-*k* are arranged on one side of the first center line L0, and the second sub-row group HZ2-*k* and the second sub-virtual area XN2-*k* are arranged on the other side of the first center line L0. Moreover, the first light emitting device 111 in the first sub-row group HZ1-*k* is electrically connected with the virtual pixel circuit 121 in the first sub-virtual area XN1-*k* through the connecting trace 210, and the first light emitting device 111 in the second sub-row group HZ2-*k* is electrically connected with the virtual pixel circuit 121 in the second sub-virtual area XN2-*k* through the connecting trace 210.

In some embodiments, as shown in FIG. 3A and FIG. 3B, in the same first row group HZ-k, the connecting traces 210 corresponding to the first sub-row group HZ1-*k* and the connecting traces 210 corresponding to the second sub-row group HZ2-*k* are symmetrically arranged with respect to the first center line L0, thereby improving symmetry of the display panel and reducing patterning process of the connecting trace.

In some embodiments, as shown in FIG. 3A and FIG. 3B, the first sub-virtual area XN1-*k* can further include: a plurality of first sub-virtual gate lines 021 and a plurality of first sub-virtual data lines 031. In the first sub-virtual area XN1-*k*, a row of the virtual pixel circuits 121 are electrically connected with one first sub-virtual gate line 021, and a column of the virtual pixel circuits 121 are electrically connected with one first sub-virtual data line 031. For the first light emitting devices 111 and the second light emitting devices 112 in the same row, the drive signals transmitted by the first sub-virtual gate line 021 electrically connected with the virtual pixel circuit 121 corresponding to the first light emitting device 111 and the drive signals transmitted by the drive gate line 131 electrically connected with the drive pixel circuit 122 corresponding to the second light emitting device 112 are the same. In this way, the first light emitting devices 111 and the second light emitting devices 112 in the same row can be lightened simultaneously. Moreover, for the first light emitting devices 111 and the second light emitting devices 112 in the same column, the first sub-virtual data line 031 electrically connected with the virtual pixel circuit 121 corresponding to the first light emitting device 111 is electrically connected with the drive data line 161 electrically connected with the drive pixel circuit 122 corresponding to the second light emitting device 112.

In some embodiments, as shown in FIG. 3A and FIG. 3B, the second sub-virtual area can further include: a plurality of second sub-virtual gate lines 022 and a plurality of second sub-virtual data lines 032. In the second sub-virtual area XN2-k, a row of the virtual pixel circuits 121 are electrically connected with one second sub-virtual gate line 022, and a column of the virtual pixel circuits 121 are electrically connected with one second sub-virtual data line 032. For the first light emitting devices 111 and the second light emitting devices 112 in the same row, the drive signals transmitted by the second sub-virtual gate line 022 electrically connected with the virtual pixel circuit 121 corresponding to the first light emitting device 111 and the drive signals transmitted by the drive gate line 131 electrically connected with the drive pixel circuit 122 corresponding to the second light emitting device 112 are the same. In this way, the first light emitting devices 111 and the second light emitting devices 112 in the same row can be lightened simultaneously. Moreover, for the first light emitting device 111 and the second light emitting device 112 in the same column, the second sub-virtual data line 032 electrically connected with the virtual pixel circuit 121 corresponding to the first light emitting device 111 is electrically connected with the drive data line 161 electrically connected with the drive pixel circuit 122 corresponding to the second light emitting device 112.

In some embodiments, as shown in FIG. 3B, the peripheral area BB can also include a gate drive circuit 150 electrically connected with a plurality of drive gate lines 131. The gate drive circuit 150 is configured to input drive signals to the plurality of drive gate lines 131, and for the first light emitting devices 111 and the second light emitting devices 112 in the same row, the first sub-virtual gate line 021 electrically connected with the virtual pixel circuit 121 corresponding to the first light emitting device 111 and the second sub-virtual gate line 022 electrically connected with the virtual pixel circuit 121 corresponding to the first light emitting device 111 are electrically connected with the drive gate line 131 electrically connected with the drive pixel circuit 122 corresponding to the second light emitting device 112. In this way, the drive gate, the first sub-virtual gate line 021 and the second sub-virtual gate line 022 can share the gate drive circuit 150.

In some embodiments, the peripheral area further includes: a gate drive circuit electrically connected with a plurality of drive gate lines, a first virtual gate drive circuit electrically connected with a plurality of first sub-virtual gate lines and a second virtual gate drive circuit electrically connected with a plurality of second sub-virtual gate lines. The gate drive circuit is configured to input drive signals to a plurality of drive gate lines, the first virtual gate drive circuit is configured to input drive signals to a plurality of first sub-gate lines, and the second virtual gate drive circuit is configured to input drive signals to a plurality of second sub-gate lines. In this way, the first sub-gate line, the second sub-pixel and the drive gate line can be independently controlled respectively.

In some embodiments, as shown in FIG. 1A and FIG. 1B, the first peripheral sub-area bb1 further includes a plurality of first virtual gate lines 132 and a plurality of first virtual data lines 162. One row of virtual pixel circuits 121 are electrically connected with one first virtual gate line 132, and one column of virtual pixel circuits 121 are electrically connected with one first virtual data line 162. In this way, drive signals can be provided to the virtual pixel circuit 121 through the first virtual gate line 132, and data display signals can be provided to the virtual pixel circuit 121 through the first virtual data line 162, then the virtual pixel circuit 121 can control the first light emitting device 111 to emit light.

In some embodiments, as shown in FIG. 1B, for the first light emitting devices 111 and the second light emitting devices 112 in the same column, the first virtual data line 162 electrically connected with the virtual pixel circuit 121 corresponding to the first light emitting device 111 is electrically connected with the drive data line 161 electrically connected with the drive pixel circuit 122 corresponding to the second light emitting device 112.

In some embodiments, as shown in FIG. 1A and FIG. 1B, for the first light emitting devices 111 and the second light emitting devices 112 in the same row, the drive signals transmitted by the first virtual gate line 132 electrically connected with the virtual pixel circuit 121 corresponding to the first light emitting device 111 and the drive gate line 131 electrically connected with the drive pixel circuit 122 corresponding to the second light emitting device 112 are the same. In this way, the first light emitting devices 111 and the second light emitting devices 112 in the same row can be lightened simultaneously.

In some embodiments, as shown in FIG. 1A and FIG. 1B, the peripheral area BB can further include: a gate drive circuit 150 electrically connected with a plurality of drive gate lines 131, the gate drive circuit 150 is configured to input drive signals to the plurality of drive gate lines 131. And, for the first light emitting devices 111 and the second light emitting devices 112 in the same row, the first virtual gate line 132 electrically connected with the virtual pixel circuit 121 corresponding to the first light emitting device 111 is electrically connected with the drive gate line 131 electrically connected with the drive pixel circuit 122 corresponding to the second light emitting device 112. In this way, the drive gate and the first virtual gate line 132 can share the gate drive circuit 150.

In some embodiments, the display panel can adopt bilateral driving mode to reduce the delay of the drive signal. For example, a gate drive circuit 150 is arranged in the third peripheral sub-area bb3 of the peripheral area BB, and another gate drive circuit 150 is arranged in the fourth peripheral sub-area bb4 of the peripheral area BB, that is, two gate drive circuits 150 are arranged in the display panel. Of course, the display panel also can adopt unilateral driving mode, for example, a gate drive circuit 150 is arranged in the third peripheral sub-area bb3 of the peripheral area BB, or a gate drive circuit 150 is arranged in the fourth peripheral sub-area bb4 of the peripheral area BB.

Figure 1C:
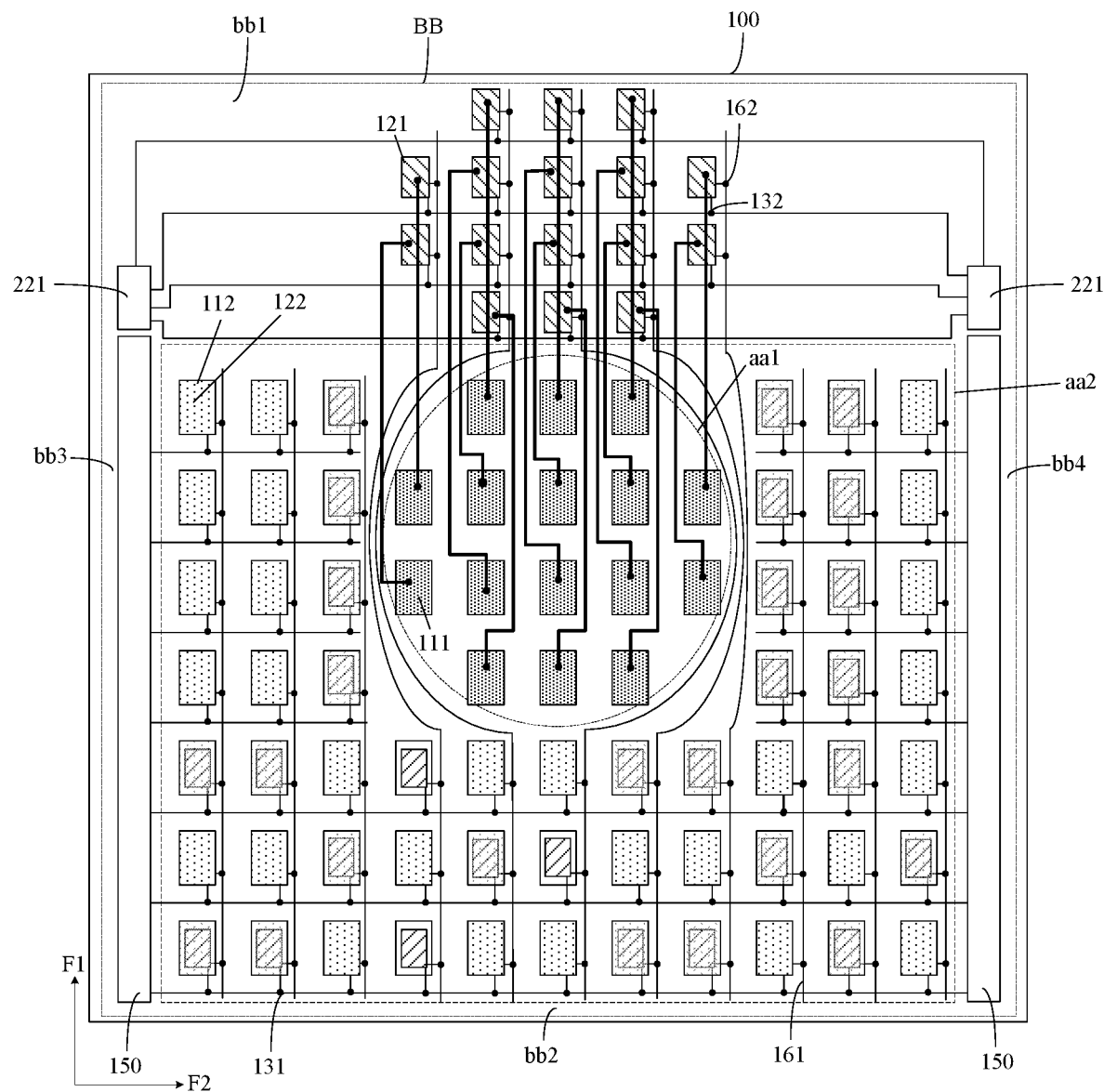
FIG. 1C is another structural schematic diagram of a display panel, provided by an embodiment of the present disclosure.

In some embodiments, the structural schematic diagram of the display panels is as shown in FIG. 1C, and deformation is made for the implementation manners in the above embodiments. Only the distinguishment between the present embodiment and the above embodiments is described below, and the same part will not be repeated redundantly herein.

In some embodiments, as shown in FIG. 1C, the peripheral area BB can further include a gate drive circuit 150 electrically connected with the plurality of drive gate lines 131, the gate drive circuit 150 is configured to input drive signals to the plurality of drive gate lines 131. In this way, the gate drive circuit 150 can input drive signals to the drive gate.

In some embodiments, the display panel can adopt bilateral driving mode to reduce the delay of the drive signal. For example, a gate drive circuit 150 is arranged in the third peripheral sub-area bb3 of the peripheral area BB, and another gate drive circuit 150 is arranged in the fourth peripheral sub-area bb4 of the peripheral area BB, that is, two gate drive circuits 150 are arranged in the display panel. Of course, the display panel also can adopt unilateral driving mode, for example, a gate drive circuit 150 is arranged in the third peripheral sub-area bb3 of the peripheral area BB, or a gate drive circuit 150 is arranged in the fourth peripheral sub-area bb4 of the peripheral area BB.

In some embodiments, as shown in FIG. 1C, the peripheral area BB can further include:

a first virtual gate drive circuit 221 electrically connected with the plurality of first virtual gate lines 132, the first virtual gate drive circuit 221 is configured to input drive signals to the plurality of first virtual gate lines 132. In this way, the drive gate and the first virtual gate line 132 can be controlled separately respectively.

In some embodiments, the display panel can adopt bilateral driving mode to reduce the delay of the drive signal. For example, a first virtual gate drive circuit 221 is arranged in the third peripheral sub-area bb3 of the peripheral area BB, and another first virtual gate drive circuit 221 is arranged in the fourth peripheral sub-area bb4 of the peripheral area BB, that is, two first virtual gate drive circuits 221 are arranged in the display panel. Of course, the display panel also can adopt unilateral driving mode, for example, a first virtual gate drive circuit 221 is arranged in the third peripheral sub-area bb3 of the peripheral area BB, or a first virtual gate drive circuit 221 is arranged in the fourth peripheral sub-area bb4 of the peripheral area BB.

Figure 4:
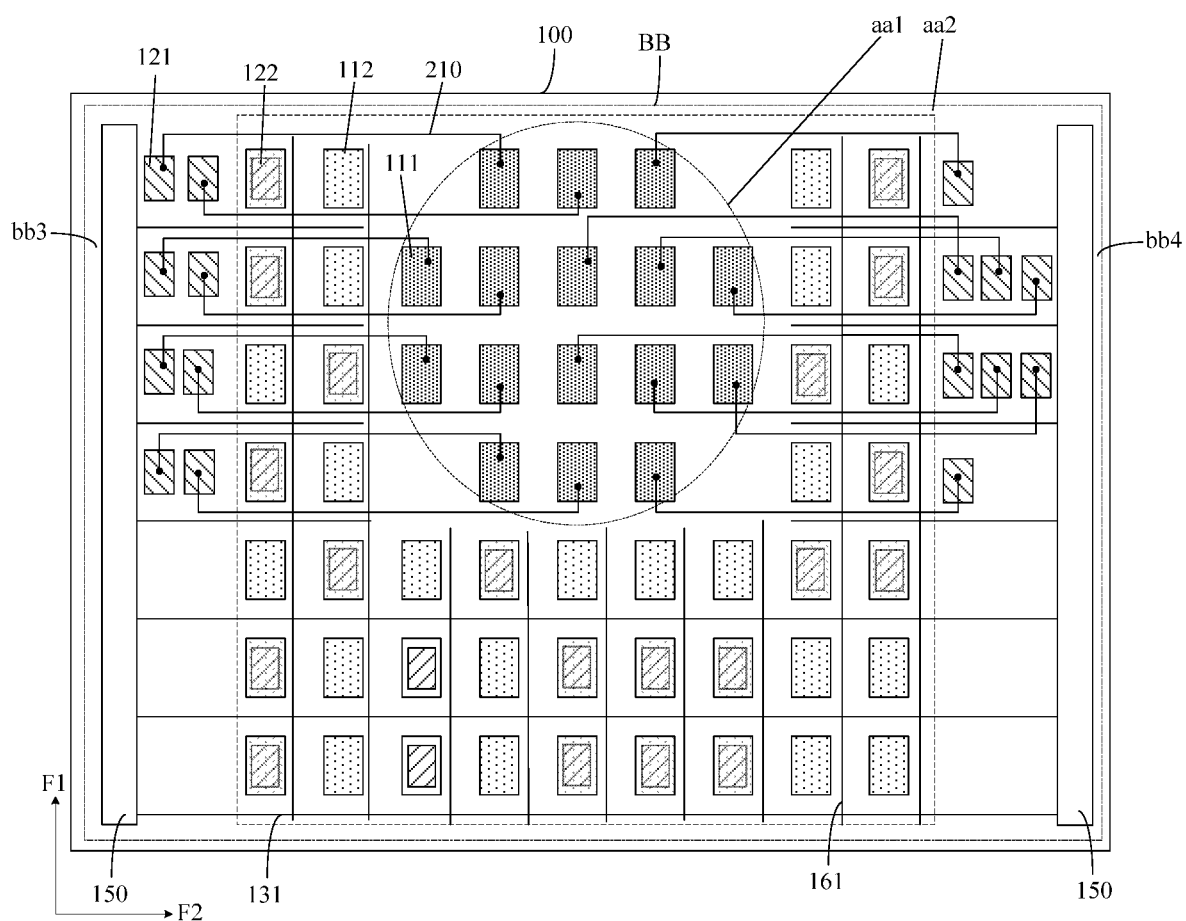
FIG. 4 is another structural schematic diagram of a display panel, provided by an embodiment of the present disclosure.

In some embodiments, the structural schematic diagram of the display panels is as shown in FIG. 4, and deformation is made for the implementation manners in the above embodiments. Only the distinguishment between the present embodiment and the above embodiments is described below, and the same part will not be repeated redundantly herein.

In some embodiments, as shown in FIG. 4, part of the plurality of virtual pixel circuits 121 are arranged in the third peripheral sub-area bb3, and the rest of the plurality of virtual pixel circuits 121 are arranged in the fourth peripheral sub-area bb4. In this way, the virtual pixel circuits 121 can be arranged in a dispersed manner, thereby reducing the width of the peripheral area BB.

In some embodiments, the number of the virtual pixel circuits 121 in the third peripheral sub-area bb3 and the number of the virtual pixel circuits 121 in the fourth peripheral sub-area bb4 can be the same. In this way, the are as occupied by the virtual pixel circuits 121 in the third peripheral sub-area bb3 and the areas occupied by the virtual pixel circuits 121 in the fourth peripheral sub-area bb4 can be possibly the same. Or, in some embodiments, the number of the virtual pixel circuits 121 in the third peripheral sub-area bb3 and the number of the virtual pixel circuits 121 in the fourth peripheral sub-area bb4 is not necessarily exactly the same, and the difference between the number of the virtual pixel circuit 121 in the third peripheral sub-area bb3 and the number of the virtual pixel circuit 121 in the fourth peripheral sub-area bb4 can be 1-10. In this way, the difference between the number of the virtual pixel circuit 121 in the third peripheral sub-area bb3 and the number of the virtual pixel circuit 121 in the fourth peripheral sub-area bb4 can be small, then the areas occupied by the virtual pixel circuits 121 in the third peripheral sub-area bb3 and the areas occupied by the virtual pixel circuits 121 in the fourth peripheral sub-area bb4 also differ slightly.

In some embodiments, as shown in FIG. 4, the third peripheral sub-area bb3 further includes: a plurality of second virtual gate lines (not shown in the figure) and a plurality of second virtual data lines (not shown in the figure). In the third peripheral sub-area bb3, one row of virtual pixel circuits 121 are electrically connected with one second virtual gate line, and one column of virtual pixel circuits 121 are electrically connected with one second virtual data line. In this way, drive signals can be provided to the virtual pixel circuit 121 in the third peripheral sub-area bb3 through the second virtual gate line, and data display signals can be provided to the virtual pixel circuit 121 in the third peripheral sub-area bb3 through the second virtual data line, then the virtual pixel circuit 121 in the third peripheral sub-area bb3 can control the first light emitting device 111 to emit light.

In some embodiments, as shown in FIG. 4, the fourth peripheral sub-area bb4 further includes: a plurality of third virtual gate lines (not shown in the figure) and a plurality of third virtual data lines (not shown in the figure). In the fourth peripheral sub-area bb4, one row of virtual pixel circuits 121 are electrically connected with one third virtual gate line, and one column of virtual pixel circuits 121 are electrically connected with one third virtual data line. In this way, drive signals can be provided to the virtual pixel circuit 121 in the fourth peripheral sub-area bb4 through the third virtual gate line, and data display signals can be provided to the virtual pixel circuit 121 in the fourth peripheral sub-area bb4 through the third virtual data line, then the virtual pixel circuit 121 in the fourth peripheral sub-area bb4 can control the first light emitting device 111 to emit light.

In some embodiments, as shown in FIG. 4, for the first light emitting devices 111 and the second light emitting devices 112 in the same column, the second virtual data line electrically connected with the virtual pixel circuit 121 corresponding to the first light emitting device 111 and the third virtual data line electrically connected with the virtual pixel circuit 121 corresponding to the first light emitting device 111 are electrically connected with the drive data line 161 electrically connected with the drive pixel circuit 122 corresponding to the second light emitting device 112.

In some embodiments, as shown in FIG. 4, for the first light emitting device 111 and the second light emitting device 112 in the same row, the drive signals transmitted by the second virtual gate line electrically connected with the virtual pixel circuit 121 corresponding to the first light emitting device 111, the drive signals transmitted by the third virtual gate line electrically connected with the virtual pixel circuit 121 corresponding to the first light emitting device 111, and the drive signals transmitted by the drive gate line 131 electrically connected with the drive pixel circuit 122 corresponding to the second light emitting device 112 are the same. In this way, the first light emitting devices 111 and the second light emitting devices 112 in the same row can be lightened simultaneously.

In some embodiments, as shown in FIG. 4, the peripheral area BB can also include a gate drive circuit 150 electrically connected with a plurality of drive gate lines 131; the gate drive circuit 150 is configured to input drive signals to the plurality of drive gate lines 131. And, for the first light emitting devices 111 and the second light emitting devices 112 in the same row, the second virtual gate line electrically connected with the virtual pixel circuit 121 corresponding to the first light emitting device 111, the third virtual gate line electrically connected with the virtual pixel circuit 121 corresponding to the first light emitting device 111, and the drive gate line 131 electrically connected with the drive pixel circuit 122 corresponding to the second light emitting device 112 are the same gate line. In this way, the drive gate, the second virtual gate line and the third virtual gate line can share the gate drive circuit 150.

In some embodiments, the display panel can adopt bilateral driving mode to reduce the delay of the drive signal. For example, a gate drive circuit 150 is arranged in the third peripheral sub-area bb3 of the peripheral area BB, and another gate drive circuit 150 is arranged in the fourth peripheral sub-area bb4 of the peripheral area BB, that is, two gate drive circuits 150 are arranged in the display panel. Of course, the display panel also can adopt unilateral driving mode, for example, a gate drive circuit 150 is arranged in the third peripheral sub-area bb3 of the peripheral area BB, or a gate drive circuit 150 is arranged in the fourth peripheral sub-area bb4 of the peripheral area BB.

In some embodiments, as shown in FIG. 4, in the third peripheral sub-area bb3, the area in which the virtual pixel circuit 121 is located and the area in which the gate drive circuit 150 is located are arranged along the first direction F1. That is, on the first direction F1, the orthographic projection of the area in which the virtual pixel circuit 121 is located is not overlapped with the orthographic projection of the area in which the gate drive circuit 150 is located. In some embodiments, on the first direction F1, the orthographic projection of the area in which the virtual pixel circuit 121 in the third peripheral sub-area bb3 is located is not overlapped with the orthographic projection of the first display area aa1.

In some embodiments, as shown in FIG. 4, in the fourth peripheral sub-area bb4, the area in which the virtual pixel circuit 121 is located and the area in which the gate drive circuit 150 is located are arranged along the first direction F1. That is, on the first direction F1, the orthographic projection of the area in which the virtual pixel circuit 121 is located is not overlapped with the orthographic projection of the area in which the gate drive circuit 150 is located. In some embodiments, on the first direction F1, the orthographic projection of the area in which the virtual pixel circuit 121 in the fourth peripheral sub-area bb4 is located is not overlapped with the orthographic projection of the first display area aa1.

Figure 5:
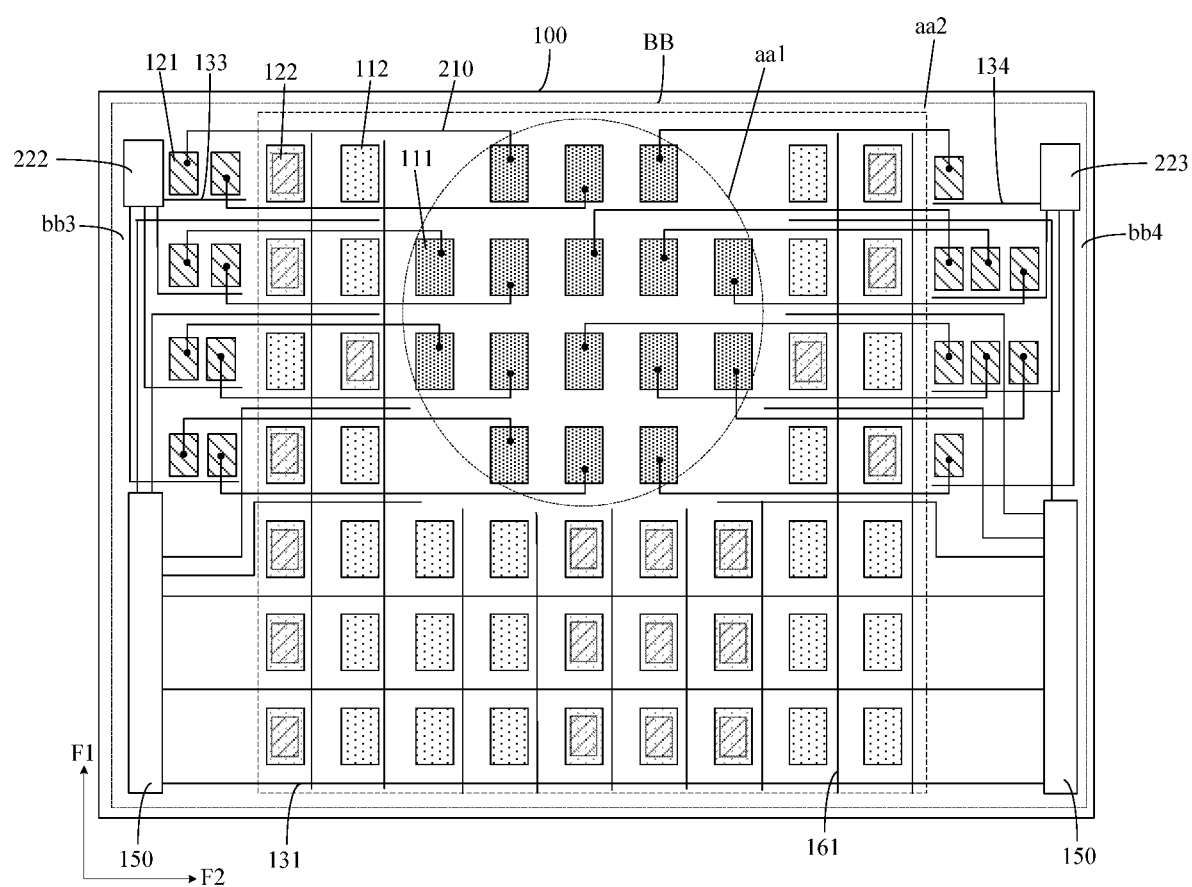
FIG. 5 is another structural schematic diagram of a display panels, provided by an embodiment of the present disclosure.

In some embodiments, the structural schematic diagram of the display panels is as shown in FIG. 5, and deformation is made aiming at the implementation manners in the above embodiments. Only the distinguishment between the present embodiment and the above embodiments is described below, and the same part will not be repeated redundantly herein.

In some embodiments, as shown in FIG. 5, the peripheral area BB can also include a gate drive circuit 150 electrically connected with a plurality of drive gate lines 131, the gate drive circuit 150 is configured to input drive signals to a plurality of drive gate lines 131. In this way, the gate drive circuit 150 can input drive signals to the drive gate.

In some embodiments, the display panel can adopt bilateral driving mode to reduce the delay of the drive signal. For example, a gate drive circuit 150 is arranged in the third peripheral sub-area bb3 of the peripheral area BB, and another gate drive circuit 150 is arranged in the fourth peripheral sub-area bb4 of the peripheral area BB, that is, two gate drive circuits 150 are arranged in the display panel. Of course, the display panel also can adopt unilateral driving mode, for example, a gate drive circuit 150 is arranged in the third peripheral sub-area bb3 of the peripheral area BB, or a gate drive circuit 150 is arranged in the fourth peripheral sub-area bb4 of the peripheral area BB.

In some embodiments, as shown in FIG. 5, the peripheral area BB can further include: a second virtual gate drive circuit 222 electrically connected with a plurality of second virtual gate lines 133 and a third virtual gate drive circuit 223 electrically connected with a plurality of third virtual gate lines 134. The second virtual gate drive circuit 222 is configured to input drive signals to a plurality of second virtual gate lines 133, and the third virtual gate drive circuit 223 is configured to input drive signals to a plurality of third virtual gate lines 134. In this way, the drive gate, the second virtual gate line 133 and the third virtual gate line 134 can be independently controlled respectively.

In some embodiments, as shown in FIG. 5, in the third peripheral sub-area bb3, the area in which the virtual pixel circuit 121 is located and the area in which the gate drive circuit 150 is located are arranged along the first direction F1. And, the area in which the second virtual gate drive circuit 222 is located and the area in which the gate drive circuit 150 is located are arranged along the first direction F1. That is, on the first direction F1, the orthographic projection of the area in which the virtual pixel circuit 121 is located is not overlapped with the orthographic projection of the area in which the gate drive circuit 150 is located. And, on the first direction F1, the orthographic projection of the area in which the second virtual gate drive circuit 222 is located is not overlapped with the orthographic projection of the area in which the gate drive circuit 150 is located. Further, on the first direction F1, the orthographic projection of the area in which the virtual pixel circuit 121 in the third peripheral sub-area bb3 is located, the orthographic projection of the area in which the second virtual gate drive circuit 222 in the third peripheral sub-area bb3 is located, and the orthographic projection of the first display area aa1 are not overlapped with each other, thereby reducing interference of the second virtual gate drive circuit 222 on the signals transmitted on the connecting trace 210.

In some embodiments, as shown in FIG. 5, in the fourth peripheral sub-area bb4, the area in which the virtual pixel circuit 121 is located and the area in which the gate drive circuit 150 is located are arranged along the first direction F1. And the area in which the third virtual gate drive circuit 223 is located and the area in which the gate drive circuit 150 is located are arranged along the first direction F1. That is, on the first direction F1, the orthographic projection of the area in which the virtual pixel circuit 121 is located is not overlapped with the orthographic projection of the area in which the gate drive circuit 150 is located, and the orthographic projection of the area in which the third virtual gate drive circuit 223 is located is not overlapped with the orthographic projection of the area in which the gate drive circuit 150 is located. In some embodiments, on the first direction F1, the orthographic projection of the area in which the virtual pixel circuit 121 in the fourth peripheral sub-area bb4 is located, the orthographic projection of the area in which the third virtual gate drive circuit 223 is located, and the orthographic projection of the first display area aa1 on the first direction F are not overlapped with each other, thereby reducing interference of the third virtual gate drive circuit 223 on the signals transmitted on the connecting trace 210.

Based on the same inventive concept, embodiments of the present disclosure further provide a display device which includes the above display panel provided in embodiments of the present disclosure. The display device solves problems based on similar principles as the aforesaid display panel, therefore, for the implementation of the display device, please refer to the implementation of the aforesaid display panel, and the repeated parts will not be repeated redundantly herein.

In some embodiments, the display device may be a mobile phone, a tablet computer, a television, a display, a notebook computer, a digital photo frame, a navigator, or any other product or component with a display function. Other indispensable components of the display device are present as understood by those skilled in the art, and are not described herein, nor should they be construed as limiting the present disclosure.

As to the display panel and display device provided in embodiments of the present disclosure, through using the drive pixel circuit in the second display area to drive the second light emitting device in the second display area to emit light, the second display area can achieve a light-emitting display effect. And, through using the virtual pixel circuit in the peripheral area to drive the first light emitting device in the first display area to emit light, the first display area can achieve a light-emitting display effect. Therefore, the whole display area can achieve a light-emitting display effect. Since the first display area is provided with a first light emitting device and is not provided with a pixel circuit or metal traces, therefore, not only the first display area can achieve a display function, but also the first display area does not need to be provided with pixel circuit and metal traces, so that light transmittance of the first display area is improved. In this way, when the display panel is applied to the display device, a front camera, a sensor, a receiver and other elements can be arranged below the first display area of the display panel, to achieve full screen design and improve the screen-to-body ratio.

Obviously, those skilled in the art can make various modifications and variations to the present disclosure without departing from the spirit and scope of the present disclosure. Thus, the present disclosure is also intended to encompass these modifications and variations thereto so long as the modifications and variations come into the scope of the claims of the present disclosure and their equivalents.

What is claimed is:

1. A display panel, comprising:
a base substrate, comprising a display area and a peripheral area surrounding the display area, wherein the display area comprises a first display area and a second display area;
a plurality of pixel circuits, comprising a plurality of virtual pixel circuits and a plurality of drive pixel circuits, wherein the plurality of virtual pixel circuits are arranged in the peripheral area, and the plurality of drive pixel circuits are arranged in the second display area;
a plurality of light emitting devices, arranged on a side, facing away from the base substrate, of the plurality of pixel circuits, wherein the plurality of light emitting devices comprise a plurality of first light emitting devices and a plurality of second light emitting devices, the plurality of first light emitting devices are arranged in the first display area, and the plurality of second light emitting devices are arranged in the second display area;
wherein at least one of the plurality of virtual pixel circuits is electrically connected with at least one of the plurality of first light emitting devices, and at least one of the plurality of drive pixel circuits is electrically connected with at least one of the plurality of second light emitting devices;
the peripheral area comprises a first peripheral sub-area and a second peripheral sub-area which are arranged oppositely, and a third peripheral sub-area and a fourth peripheral sub-area which are arranged oppositely;
the first peripheral sub-area, the first display area and the second peripheral sub-area are arranged along a first direction, and the third peripheral sub-area, the first display area and the fourth peripheral sub-area are arranged along a second direction, wherein the first direction is different from the second direction; and
the plurality of virtual pixel circuits are arranged in at least one of the first peripheral sub-area, the second peripheral sub-area, the third peripheral sub-area and the fourth peripheral sub-area, and the at least one of the plurality of virtual pixel circuits is electrically connected with the at least one of the plurality of first light emitting devices through at least one connecting trace.

2. The display panel according to claim 1, wherein the plurality of first light emitting devices are arranged in the first display area in an array, and the plurality of second light emitting devices are arranged in the second display area in an array, wherein a row of the plurality of first light emitting devices and a row of the plurality of second light emitting devices are arranged in the same row; and/or, a column of the plurality of first light emitting devices and a column of the plurality of second light emitting devices are arranged in the same column.

3. The display panel according to claim 2, wherein a distance between the first peripheral sub-area and the first display area is less than a distance between the second peripheral sub-area and the first display area, and the plurality of virtual pixel circuits are arranged in the first peripheral sub-area.

4. The display panel according to claim 3, wherein the first peripheral sub-area comprises a plurality of first virtual areas which are arranged along the second direction, and the plurality of virtual pixel circuits are respectively arranged in an array in each of the plurality of first virtual areas;
the plurality of first light emitting devices are divided into a plurality of first row groups; and each of the plurality of first row groups comprises at least two adjacent rows of the plurality of first light emitting devices; and
one of the plurality of first row groups corresponds to one of the plurality of first virtual areas, and one of the plurality of first light emitting devices in the one of the plurality of first row groups is electrically connected with one of the plurality of virtual pixel circuits in the corresponding one of the plurality of first virtual areas through the at least one connecting trace.

5. The display panel according to claim 4, wherein the one of the plurality of first row groups comprises a first sub-row group and a second sub-row group; the first display area has a first center line along the first direction, and the plurality of first light emitting devices in the first sub-row group and the plurality of first light emitting devices in the second sub-row group are symmetrically arranged with respect to the first center line;
the one of the plurality of first virtual areas comprises a first sub-virtual area and a second sub-virtual area; wherein the first sub-virtual area and the second sub-virtual area are symmetrically arranged with respect to the first center line, and the first sub-row group and the first sub-virtual area are arranged on the same side of the first center line;

the one of the plurality of first light emitting devices in the first sub-row group is electrically connected with the one of the plurality of virtual pixel circuits in the first sub-virtual area through the connecting trace; and the one of the plurality of first light emitting devices in the second sub-row group is electrically connected with the one of the plurality of virtual pixel circuits in the second sub-virtual area through the connecting trace.

6. The display panel according to claim 5, wherein in the same one of the plurality of first row groups, connecting traces corresponding to the first sub-row group and connecting traces corresponding to the second sub-row group are symmetrically arranged with respect to the first center line.

7. The display panel according to claim 5, wherein the second display area further comprises a plurality of drive gate lines and a plurality of drive data lines; a row of the plurality of drive pixel circuits are electrically connected with one of the plurality of drive gate lines, and a column of the plurality of drive pixel circuits are electrically connected with one of the plurality of drive data lines;

the first sub-virtual area further comprises: a plurality of first sub-virtual gate lines and a plurality of first sub-virtual data lines; wherein in the first sub-virtual area, a row of the plurality of virtual pixel circuits are electrically connected with one of the plurality of first sub-virtual gate lines, and a column of the plurality of virtual pixel circuits are electrically connected with one of the plurality of first sub-virtual data lines;

the second sub-virtual area further comprises: a plurality of second sub-virtual gate lines and a plurality of second sub-virtual data lines; wherein in the second sub-virtual area, a row of the plurality of virtual pixel circuits are electrically connected with one of the plurality of second sub-virtual gate lines, and a column of the plurality of virtual pixel circuits are electrically connected with one of the plurality of second sub-virtual data lines;

for the plurality of first light emitting devices and the plurality of second light emitting devices in the same row, a drive signal transmitted by the one of the plurality of first sub-virtual gate lines electrically connected with the one of the plurality of virtual pixel circuits corresponding to the at least one of the plurality of first light emitting devices, a drive signal transmitted by the one of the plurality of second sub-virtual gate lines electrically connected with the one of the plurality of virtual pixel circuits corresponding to the at least one of the plurality of first light emitting devices, and a drive signal transmitted by the one of the plurality of drive gate lines electrically connected with the at least one of the plurality of drive pixel circuits corresponding to the at least one of the plurality of second light emitting devices are the same; and for the plurality of first light emitting devices and the plurality of second light emitting devices in the same column, the one of the plurality of first sub-virtual data lines electrically connected with the one of the plurality of virtual pixel circuits corresponding to the at least one of the plurality of first light emitting devices, the one of the plurality of second sub-virtual data lines electrically connected with the one of the plurality of virtual pixel circuits corresponding to the at least one of the plurality of first light emitting devices, and the one of the plurality of drive data lines electrically connected with the at least one of the plurality of drive pixel circuits corresponding to the at least one of the plurality of second light emitting devices are electrically connected with each other.

8. The display panel according to claim 7, wherein the peripheral area further comprises: a gate drive circuit electrically connected with the plurality of drive gate lines, wherein the gate drive circuit is configured to input the drive signals to the plurality of drive gate lines, and for the plurality of first light emitting devices and the plurality of second light emitting devices in the same row, the one of the plurality of first sub-virtual gate lines electrically connected with the one of the plurality of virtual pixel circuits corresponding to the at least one of the plurality of first light emitting devices, and the one of the plurality of second sub-virtual gate lines electrically connected with the one of the plurality of virtual pixel circuits corresponding to the at least one of the plurality of first light emitting devices are electrically connected with the one of the plurality of drive gate lines which is electrically connected with the at least one of the plurality of drive pixel circuits corresponding to the at least one of the plurality of second light emitting devices; or, the peripheral area further comprises: a gate drive circuit electrically connected with the the peripheral area further comprises: a gate drive circuit electrically connected with the plurality of drive gate lines, a first virtual gate drive circuit electrically connected with the plurality of first sub-virtual gate lines, and a second virtual gate drive circuit electrically connected with the plurality of second sub-virtual gate lines; wherein the gate drive circuit is configured to input the drive signals to the plurality of drive gate lines, the first virtual gate drive circuit is configured to input the drive signals to the plurality of first sub-gate lines, and the second virtual gate drive circuit is configured to input the drive signals to the plurality of second sub-gate lines.

9. The display panel according to claim 1, wherein part of the plurality of virtual pixel circuits are arranged in the third peripheral sub-area, and the rest of the plurality of virtual pixel circuits are arranged in the fourth peripheral sub-area.

10. The display panel according to claim 9, wherein the second display area further comprises a plurality of drive gate lines and a plurality of drive data lines; wherein a row of the plurality of drive pixel circuits are electrically connected with one of the plurality of drive gate lines, and a column of the plurality of drive pixel circuits are electrically connected with one of the plurality of drive data lines;

the third peripheral sub-area further comprises: a plurality of second virtual gate lines and a plurality of second virtual data lines; wherein in the third peripheral sub-area, a row of the plurality of virtual pixel circuits are electrically connected with one of the plurality of second virtual gate lines, and a column of the plurality of virtual pixel circuits are electrically connected with one of the plurality of second virtual data lines;

the fourth peripheral sub-area further comprises: a plurality of third virtual gate lines and a plurality of third virtual data lines; wherein in the fourth peripheral sub-area, a row of the plurality of virtual pixel circuits are electrically connected with one of the plurality of third virtual gate lines, and a column of the plurality of virtual pixel circuits are electrically connected with one of the plurality of third virtual data lines;

for the plurality of first light emitting devices and the plurality of second light emitting devices in the same row, a drive signal transmitted by the one of the plurality of second virtual gate lines electrically connected with the at least one of the plurality of virtual pixel circuits corresponding to the at least one of the plurality of first light emitting devices, a drive signal transmitted by the one of the plurality of third virtual gate lines electrically connected with the at least one of the plurality of virtual pixel circuits corresponding to the at least one of the plurality of first light emitting devices, and a drive signal transmitted by the one of the plurality of drive gate lines electrically connected with the at least one of the plurality of drive pixel circuits of the corresponding at least one of the plurality of second light emitting devices are the same; and for the plurality of first light emitting devices and the plurality of second light emitting devices in the same column, the one of the plurality of second virtual data lines electrically connected with the at least one of the plurality of virtual pixel circuits corresponding to the at least one of the plurality of first light emitting devices, the one of the plurality of third virtual data lines electrically connected with the at least one of the plurality of virtual pixel circuits corresponding to the at least one of the plurality of first light emitting devices, and the one of the plurality of drive data lines electrically connected with the at least one of the plurality of drive pixel circuits corresponding to the at least one of the plurality of second light emitting devices are electrically connected with each other.

11. The display panel according to claim 10, wherein the peripheral area further comprises: a gate drive circuit electrically connected with the plurality of drive gate lines, wherein the gate drive circuit is configured to input the drive signals to the plurality of drive gate lines, and for the plurality of first light emitting devices and the plurality of second light emitting devices in the same row, the one of the plurality of second virtual gate lines electrically connected with the at least one of the plurality of virtual pixel circuits corresponding to the at least one of the plurality of first light emitting devices, the one of the plurality of third virtual gate lines electrically connected with the at least one of the plurality of virtual pixel circuits corresponding to the at least one of the plurality of first light emitting devices, and the one of the plurality of drive gate lines electrically connected with the at least one of the plurality of drive pixel corresponding to the at least one of the plurality of second light emitting devices are the same gate line; or, circuits the peripheral area further comprises: a gate drive circuit electrically connected with the plurality of drive gate lines, a second virtual gate drive circuit electrically connected with the plurality of second virtual gate lines and a third virtual gate drive circuit electrically connected with the plurality of third virtual gate lines, wherein the gate drive circuit is configured to input the drive signals to the plurality of drive gate lines, the second virtual gate drive circuit is configured to input the drive signals to the plurality of second virtual gate lines, and the third virtual gate drive circuit is configured to input the drive signals to the plurality of third virtual gate lines.

12. A display device, comprising the display panel according to claim 1.

13. The display device according to claim 12, wherein the plurality of first light emitting devices are arranged in the first display area in an array, and the plurality of second light emitting devices are arranged in the second display area in an array, wherein a row of the plurality of first light emitting devices and a row of the plurality of second light emitting devices are arranged in the same row; and/or, a column of the plurality of first light emitting devices and a column of the plurality of second light emitting devices are arranged in the same column.

14. The display device according to claim 12, wherein a distance between the first peripheral sub-area and the first display area is less than the distance between the second peripheral sub-area and the first display area, and the plurality of virtual pixel circuits are arranged in the first peripheral sub-area.

15. The display device according to claim 14, wherein the first peripheral sub-area comprises a plurality of first virtual areas which are arranged along the second direction, and the plurality of virtual pixel circuits are respectively arranged in an array in each of the plurality of first virtual areas;

the plurality of first light emitting devices are divided into a plurality of first row groups; and each of the plurality of first row groups comprises at least two adjacent rows of the plurality of first light emitting devices; and one of the plurality of first row groups corresponds to one of the plurality of first virtual areas, and one of the plurality of first light emitting devices in the one of the plurality of first row groups is electrically connected with one of the plurality of virtual pixel circuits in the corresponding one of the plurality of first virtual areas through the at least one connecting trace.

16. The display device according to claim 15, wherein the one of the plurality of first row groups comprises a first sub-row group and a second sub-row group; the first display area has a first center line along the first direction, and the plurality of first light emitting devices in the first sub-row group and the plurality of first light emitting devices in the second sub-row group are symmetrically arranged with respect to the first center line;

the one of the plurality of first virtual areas comprises a first sub-virtual area and a second sub-virtual area; wherein the first sub-virtual area and the second sub-virtual area are symmetrically arranged with respect to the first center line, and the first sub-row group and the first sub-virtual area are arranged on the same side of the first center line;

the one of the plurality of first light emitting devices in the first sub-row group is electrically connected with the one of the plurality of virtual pixel circuits in the first sub-virtual area through the connecting trace; and the one of the plurality of first light emitting devices in the second sub-row group is electrically connected with the one of the plurality of virtual pixel circuits in the second sub-virtual area through the connecting trace.

17. The display device according to claim 16, wherein in the same one of the plurality of first row groups, connecting traces corresponding to the first sub-row group and connecting traces corresponding to the second sub-row group are symmetrically arranged with respect to the first center line.

18. The display device according to claim 16, wherein the second display area further comprises a plurality of drive gate lines and a plurality of drive data lines; a row of the plurality of drive pixel circuits are electrically connected with one of the plurality of drive gate lines, and a column of the plurality of drive pixel circuits are electrically connected with one of the plurality of drive data lines;

the first sub-virtual area further comprises: a plurality of first sub-virtual gate lines and a plurality of sub-virtual data lines; wherein in the first sub-virtual area, a row of the plurality of virtual pixel circuits are electrically connected with one of the plurality of first sub-virtual gate lines, and a column of the plurality of virtual pixel circuits are electrically connected with one of the plurality of first sub-virtual data lines;

the second sub-virtual area further comprises: a plurality of second sub-virtual gate lines and a plurality of second sub-virtual data lines; wherein in the second sub-virtual area, a row of the plurality of virtual pixel circuits are electrically connected with one of the plurality of second sub-virtual gate lines, and a column of the plurality of virtual pixel circuits are electrically connected with one of the plurality of second sub-virtual data lines;

for the plurality of first light emitting devices and the plurality of second light emitting devices in the same row, a drive signal transmitted by the one of the plurality of first sub-virtual gate lines electrically connected with the one of the plurality of virtual pixel circuits corresponding to the at least one of the plurality of first light emitting devices, a drive signal transmitted by the one of the plurality of second sub-virtual gate lines electrically connected with the one of the plurality of virtual pixel circuits corresponding to the at least one of the plurality of first light emitting devices, and a drive signal transmitted by the one of the plurality of drive gate lines electrically connected with the at least one of the plurality of drive pixel circuits corresponding to the at least one of the plurality of second light emitting devices are the same; and for the plurality of first light emitting devices and the plurality of second light emitting devices in the same column, the one of the plurality of first sub-virtual data lines electrically connected with the one of the plurality of virtual pixel circuits corresponding to the at least one of the plurality of first light emitting devices, the one of the plurality of second sub-virtual data lines electrically connected with the one of the plurality of virtual pixel circuits corresponding to the at least one of the plurality of first light emitting devices, and the one of the plurality of drive data lines electrically connected with the at least one of the plurality of drive pixel circuits corresponding to the at least one of the plurality of second light emitting devices are electrically connected with each other.

* * * * *